(12) United States Patent
Kim et al.

(10) Patent No.: US 12,041,841 B2
(45) Date of Patent: Jul. 16, 2024

(54) DISPLAY DEVICE CONFIGURED TO PREVENT PROPAGATION OF CRACKS, AND METHOD OF REPAIRING SAME

(71) Applicant: LG Display Co., Ltd., Seoul (KR)

(72) Inventors: Juhyuk Kim, Paju-si (KR); Yongsun Jo, Paju-si (KR); Deuksoo Jung, Paju-si (KR); Junggil Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 246 days.

(21) Appl. No.: 17/560,143

(22) Filed: Dec. 22, 2021

(65) Prior Publication Data

US 2022/0209210 A1 Jun. 30, 2022

(30) Foreign Application Priority Data

Dec. 24, 2020 (KR) .......................... 10-2020-0183263

(51) Int. Cl.
*H10K 71/00* (2023.01)
*H10K 59/121* (2023.01)
*H10K 59/126* (2023.01)
*H10K 59/88* (2023.01)

(52) U.S. Cl.
CPC ......... *H10K 71/00* (2023.02); *H10K 59/1213* (2023.02); *H10K 59/1216* (2023.02); *H10K 59/126* (2023.02); *H10K 59/88* (2023.02); *H10K 71/861* (2023.02)

(58) Field of Classification Search
CPC ............. H10K 59/121; H10K 59/1213; H10K 59/1216; H10K 59/126; H10K 59/1201; H10K 59/88; H10K 71/00; H10K 71/861
USPC ......................................................... 257/40
See application file for complete search history.

(56) References Cited

U.S. PATENT DOCUMENTS

| | | | |
|---|---|---|---|
| 2017/0012093 A1* | 1/2017 | Ono | H10K 59/126 |
| 2019/0027549 A1* | 1/2019 | Ai | H10K 59/1213 |
| 2022/0013619 A1* | 1/2022 | Lee | G09G 3/3233 |
| 2023/0035664 A1* | 2/2023 | An | G09G 3/3233 |

FOREIGN PATENT DOCUMENTS

KR 10-2017-0081015 A 7/2017

* cited by examiner

*Primary Examiner* — Matthew E. Gordon
(74) *Attorney, Agent, or Firm* — Seed IP Law Group LLP

(57) ABSTRACT

A display device includes: a substrate on which circuit elements constituting a pixel are arranged; a repair pattern arranged overlying the substrate; a buffer layer covering the repair pattern; an active layer arranged overlying the buffer layer; a conductive layer which is arranged overlying the active layer and on which electrodes of the circuit elements are arranged; an overcoat layer covering the conductive layer; and a light emitting element arranged overlying the overcoat layer. The repair pattern is arranged in such a manner that one region thereof overlaps the active layer.

14 Claims, 7 Drawing Sheets

DISPLAY DEVICE CONFIGURED TO PREVENT PROPAGATION OF CRACKS, AND METHOD OF REPAIRING SAME

CROSS REFERENCE TO RELATED APPLICATION

The present application claims priority to Korean Patent Application No. 10-2020-0183263, filed Dec. 24, 2020 the entire contents of which is incorporated herein for all purposes by this reference.

BACKGROUND

Technical Field

The present disclosure relates to a display device and a method of repairing the display device.

Description of the Related Art

A display device includes a display panel on which a plurality of pixels are provided. In a case where a malfunction occurs in a specific pixel, the specific pixel never emits light. Thus, the specific pixel may be visible as a bright point (spot) or a dark point to a user. In recent years, research has been conducted on a pixel structure for repairing a malfunctioning pixel visible as the bright point (spot) or the dark point.

The foregoing is intended merely to aid in the understanding of the background of the present disclosure, and is not intended to mean that the present disclosure falls within the purview of the related art that is already known to those skilled in the art.

BRIEF SUMMARY

A technical feature of embodiments is to provide a pixel repair structure in which a repair pattern is stacked under an active layer.

In this structure, when the repair pattern is cut by a laser beam emitted from the outside, a crack may propagate to the active layer stacked above the repair pattern. The occurrence of the crack may result in causing the active layer to be cut.

Another technical feature of embodiments is to provide a display device capable of separating a pixel circuit having a malfunctioning pixel from a light emitting element by cutting an active layer and a method of repairing the display device.

According to an embodiment, there is provided a display device including: a substrate on which circuit elements are arranged, the circuit elements being configured to drive a pixel; a repair pattern arranged overlying the substrate; a buffer layer covering the repair pattern; an active layer arranged overlying the buffer layer; a conductive layer which is arranged overlying the active layer, the conductive layer including electrodes of the circuit elements; an overcoat layer covering the conductive layer; and a light emitting element arranged overlying the overcoat layer. The repair pattern is arranged in such a manner that one region thereof overlaps the active layer.

In the display device, the repair pattern may be an electrode in an isolated form, the electrode being formed of a metal material.

In the display device, the active layer may be divided into cut-off regions at the vicinity of opposite ends of the repair pattern.

In the display device, the active layer may include: a first region overlapping the repair pattern; and second regions adjacent to opposite end portions, respectively, of the first region.

In the display device, the first region and the second regions may be separated from each other.

In the display device, a step may be formed between the first region and each of the second regions.

In the display device, the circuit elements each may include: a storage capacitor; a switching transistor storing a voltage corresponding to a data signal in the storage capacitor, in response to a first gate signal; a drive transistor configured to control an amount of drive electric current to be applied to the light emitting element in a manner that corresponds to the voltage stored in the storage capacitor; and a sensing transistor configured to sense features of the circuit elements in response to a second gate signal, wherein the active layer overlapping the repair pattern is an active layer constituting the sensing transistor.

The display device may further include a light blocking layer arranged on a layer that is the same as the repair pattern and arranged in a manner that overlaps the drive transistor.

The display device may further include a lower polarizer arranged underneath the substrate.

In the display device, the active layer may be formed of indium-gallium-zinc-oxide (IGZO), and the repair pattern may be formed of copper.

In the display device, the active layer may be formed in such a manner to have a thickness of about 300 Å.

According to another embodiment, there is provided a method of repairing a display device, the display device including a substrate on which circuit elements constituting a pixel are arranged, a repair pattern arranged overlying the substrate, a buffer layer covering the repair pattern, an active layer arranged overlying the buffer layer, one region of the active layer being arranged in a manner that overlaps the repair pattern, a conductive layer which is arranged overlying the active layer and on which electrodes of the circuit elements are arranged; an overcoat layer covering the conductive layer; and a light emitting element arranged overlying the overcoat layer.

The method may include: inspecting a malfunctioning pixel in the display device; and emitting a laser beam to the repair pattern in the malfunctioning pixel.

In the method, when the repair pattern is cut by the laser beam, the active layer may be cut due to a crack occurring in the buffer layer and the active layer.

In the method, the active layer may be cut at the vicinity of opposite ends of the repair pattern.

In the method, when the active layer is cut, a step is formed on both sides of the cut-off regions.

In the method, the laser beam may be in an infrared band.

With the display device and the method of repairing the display device according to the embodiments, it is possible that the malfunctioning pixel is repaired by cutting the active layer, instead of the conductive layer in the pixel circuit, using the laser beam.

When the malfunctioning pixel is repaired by cutting the active layer using the laser beam, a problem can be solved in which the insulating layer and the light emitting element that are arranged above are damaged when repairing the malfunctioning pixel through the laser beam cutting.

When the malfunctioning pixel is repaired by cutting the active layer using the laser beam, a problem can be prevented in which a laser beam in a specific wavelength that is used to cut the conductive layer damages a lower polarizer.

BRIEF DESCRIPTION OF THE SEVERAL VIEWS OF THE DRAWINGS

The above and other features and other advantages of the present disclosure will be more clearly understood from the following detailed description when taken in conjunction with the accompanying drawings, in which.

DETAILED DESCRIPTION

Figure 1:
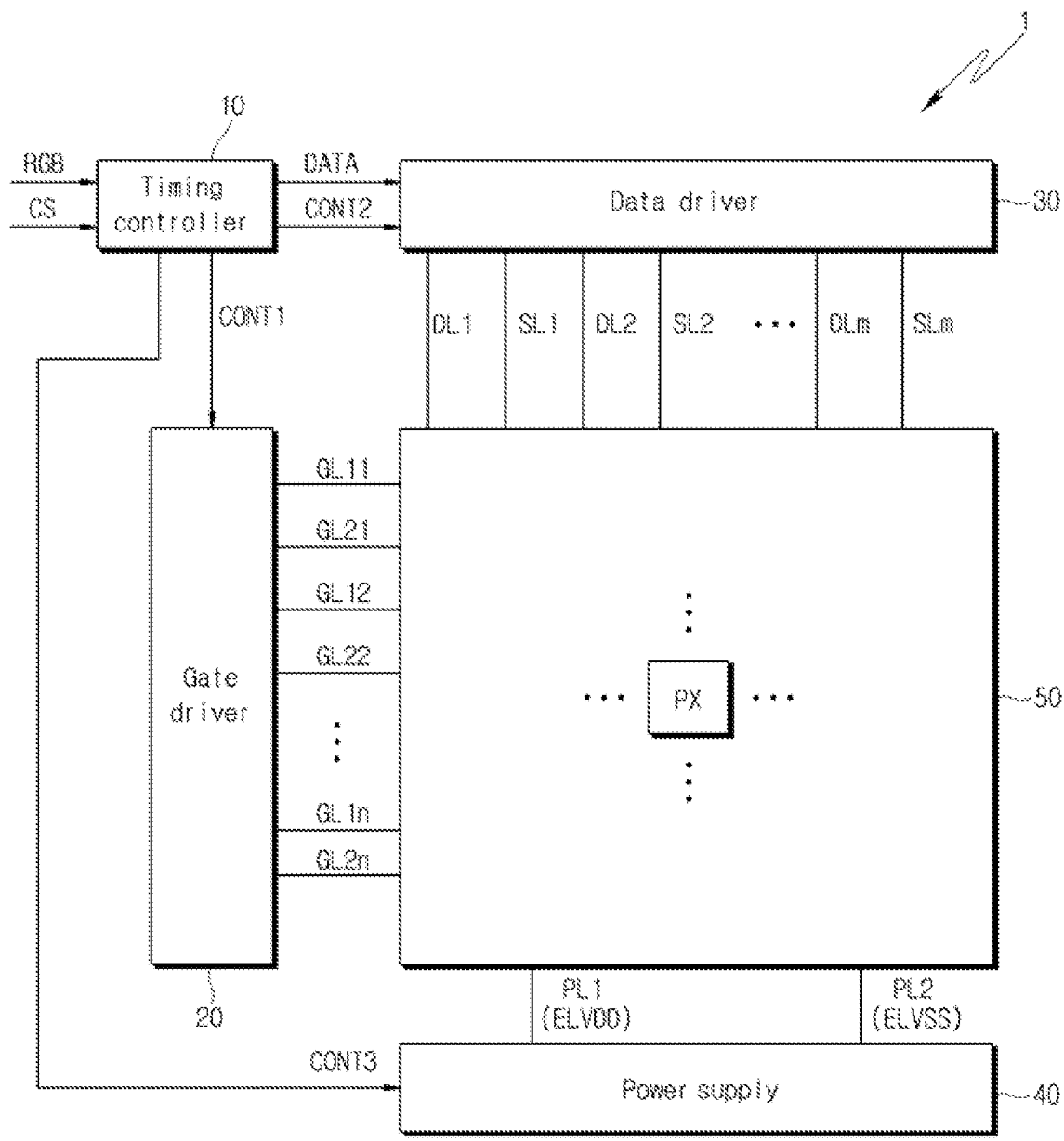
FIG. 1 is a block diagram illustrating a configuration of a display device according to an embodiment.

Embodiments will be described below with reference to the drawings. Throughout the present specification, in a case where a constituent element (or a region, a layer, a portion, or the like) is described as being "present on," "connected to," or "combined with" a different constituent element, this means that a constituent element may be connected/combined directly to/with a different constituent element or that a third constituent element may be arranged therebetween.

The same reference numeral refers to the same constituent element. In addition, for effective description of the technical contents, thicknesses, ratios, and dimensions of constituent elements are expressed in an exaggerated manner in the drawings. The phrase "and/or" is used to include one or more combinations that may be defined by relevant constituents.

The terms first, second, and so on may be used to describe various constituent elements but should not impose any limitation on the meanings thereof. These terms are used only to distinguish one element from another. For example, a first constituent element may be named a second constituent element without departing from the scope of the claimed disclosure. Similarly, the second constituent element may be named the first constituent element. The indefinite article "a/an" is used to mean one or more, not only one, except as distinctively expressed in context.

The terms, "under," "below," "over," "above" and so on are used to describe a physical relationship between constituent elements that are illustrated in the drawings. These terms have the relative conceptual meaning and are used with reference to directions indicated in the drawings.

It should be understood that the terms "include," "have," and the like are intended to indicate that a feature, a number, a step, an operation, a constituent element, a component, or a combination of these, which is described in the present specification, is present. Therefore, it should be understood that the terms do not negate in advance the likelihood that one or more other features, numbers, steps, operations, constituent elements, components, or combinations of these will be present and added.

FIG. 1 is a block diagram illustrating a configuration of a display device according to an embodiment.

With reference to FIG. 1, a display device 1 includes a timing controller 10, a gate drive unit 20, a data drive unit 30, a power supply unit 40, and a display panel 50. The gate drive unit 20 may be or include gate drive circuitry, and may be referred to as the gate drive circuitry 20. The data drive unit 30 may be or include data drive circuitry, and may be referred to as the data drive circuitry 30. The power supply unit 40 may be or include power supply circuitry, and may be referred to as the power supply circuitry 40.

The timing controller 10 may receive an image signal RGB and a control signal CS from the outside. The image signal RGB may include a plurality of pieces of gradation data. The control signal CS, for example, may include a horizontal synchronization signal, a vertical synchronization signal, and a main clock signal. The timing controller 10 may be or include timing control circuitry, and may be referred to as the timing control circuitry 10.

The timing controller 10 may process the image signal RGB and the control signal CS in such a manner as to be suitable for a condition for operating the display panel 50 and may generate and output an image data DATA, a gate drive control signal CONT1, a data drive control signal CONT2, and a power supply control signal CONT3.

The gate drive unit 20 may generate gate signals on the basis of the gate drive control signal CONT1 that is output from the timing controller 10. The gate drive unit 20 may provide the generated gate signals to pixels PXs through a plurality of first gate lines GL11 to GL1n.

The gate drive unit 20 may provide a sensing signal to the pixels PXs through a plurality of second gate lines GL21 to GL2n. The sensing signal may be supplied to measure features of a drive transistor and/or a light emitting element that are provided within each of the pixels PXs.

The data drive unit 30 may generate data signals on the basis of the image data DATA and the data drive control signal CONT2 that are output from the timing controller 10. The data drive unit 30 may provide the generated data signals to the pixels PXs through a plurality of data lines DL1 to DLm.

The data drive unit 30 may provide a reference voltage (or a sensing voltage or an initialization voltage) to the pixels PXs through a plurality of sensing lines SL1 to SLm or may sense states of the pixels PXs on the basis of electric signals fed back from the pixels PXs.

The power supply unit 40 may generate a drive voltage to be provided to the display panel 50 on the basis of the power supply control signal CONT3. The drive voltage, for example, may include a high-electric-potential drive voltage ELVDD and a low-electric-potential drive voltage ELVSS. The power supply unit 40 may provide the generated drive voltages ELVDD and ELVSS to the pixels PXs through corresponding power lines PL1 and PL2, respectively.

A plurality of pixels PXs (or referred to as sub-pixels) are arranged in the display panel 50. The pixels PXs, for example, may be arranged in matrix form on top of or overlying the display panel 50. The pixels PXs may emit light at luminance levels corresponding to the gate signal and the data signal that are supplied through the first gate lines GL11 to GL1n and the data lines DL1 to DLm, respectively. In an embodiment, each of the pixels PXs may display one of red, green, blue colors, but the present disclosure is not limited to these colors.

The timing controller 10, the gate drive unit 20, the data drive unit 30, and the power supply unit 40 may be configured as separate integrated circuits (ICs), or at least one of these constituent elements may be configured to be integrated, as an integrated circuit, with one or more other constituent components. For example, at least one of the data drive unit 30 and the power supply unit 40 may be configured to be integrated, as an integrated circuit, with the timing controller 10.

In addition, in FIG. 1, the gate drive unit 20 and the data drive unit 30 are illustrated as constituent elements separated from the display panel 50. However, at least one of the gate drive unit 20 and the data drive unit 30 may be configured in such a manner as to be formed integrally with the display panel 50 using an in-panel method. For example, the gate drive unit 20 may be formed integrally with the display panel 50 using a gate-in-panel (GIP) method.

Figure 2:
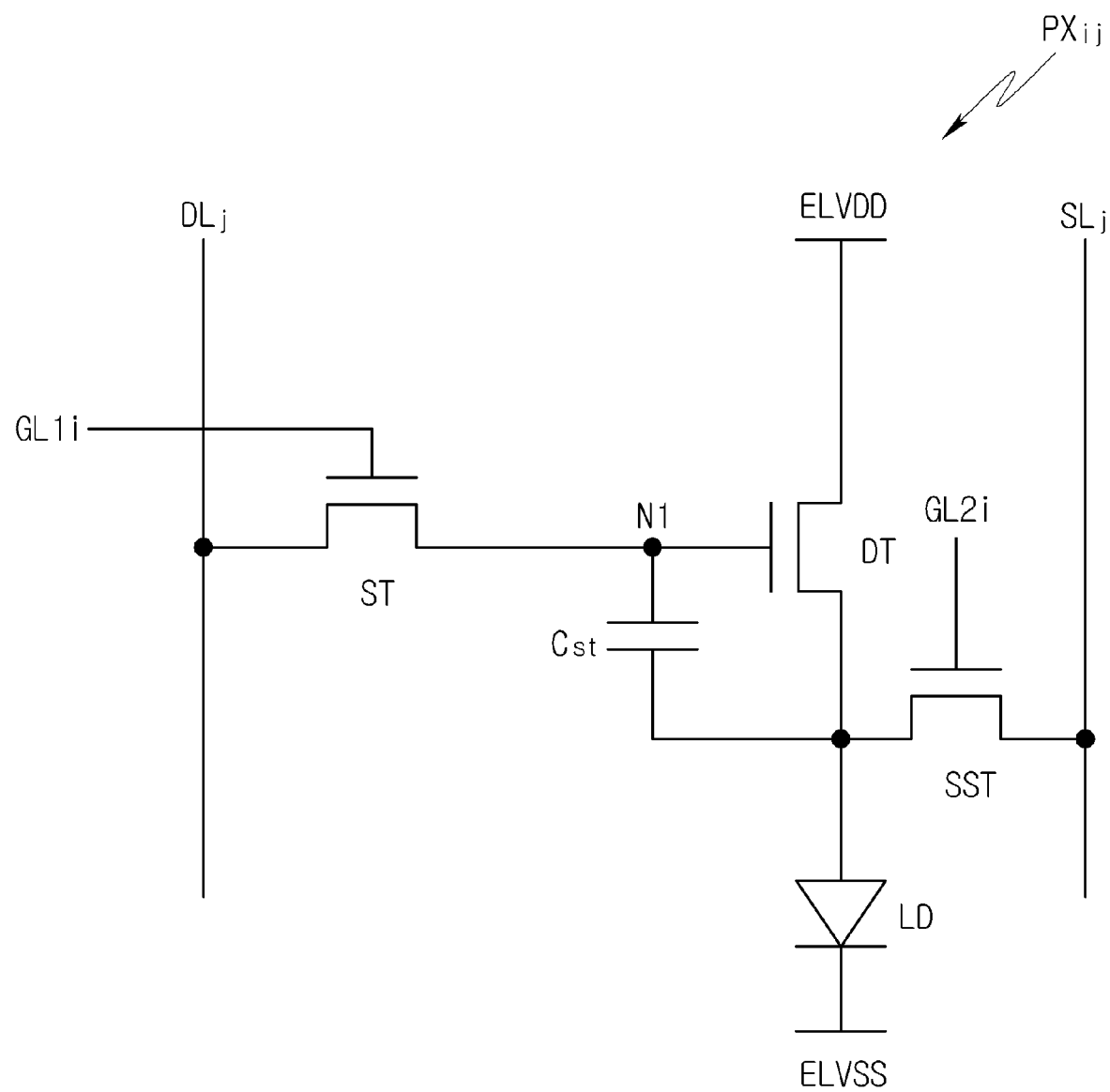
FIG. 2 is a view illustrating a circuit of an implementation example of a pixel illustrated in FIG. 1.

FIG. 2 is a view illustrating a circuit of an implementation example of a pixel illustrated in FIG. 1. FIG. 2 illustrates a pixel PXij, as an implementation example, that is connected to an i-th first gate line GL1i and a j-th data line DLj.

With reference to FIG. 2, the pixel PX includes a switching transistor ST, a drive transistor DT, a sensing transistor SST, a storage capacitor Cst, and a light emitting element LD.

A first electrode of the switching transistor ST is connected to a data line DLj, and a second electrode thereof is connected to a first node N1. A gate electrode of the switching transistor ST is connected to a first gate line GL1i. When the gate signal at a gate-on level is applied to the first gate line GL1i, the switching transistor ST is turned on and transfers to the first node N1 the data signal that is applied to the data line DLj.

A first electrode of the storage capacitor Cst may be configured in such a manner as to be connected to the first node N1, and a second electrode thereof may be configured to receive the high-electric-potential drive ELVDD. The storage capacitor Cst may be charged with a voltage corresponding to a difference between a voltage applied to the first node N1 and the high-electric-potential drive voltage ELVDD.

A first electrode of the drive transistor DT is configured in such a manner to receive the high-electric-potential drive voltage ELVDD, and a second electrode thereof is connected to a first electrode (for example, an anode electrode) of the light emitting element LD. A gate electrode of the drive transistor DT is connected to the first node N1. When a voltage at the gate-on level is applied through the first node N1, the drive transistor DT is turned on, and thus may control an amount of drive electric current that flows through the light emitting element LD in a manner that corresponds to a voltage provided to the gate electrode, that is, a voltage stored in the storage capacitor Cst.

A first electrode of the sensing transistor SST is connected to the sensing line SLj, and a second electrode thereof is connected to the first electrode of the light emitting element LD. A gate electrode of the sensing transistor SST is connected to a second gate line GL2i. When the gate signal at the gate-on level is applied to the second gate line GL2i, the sensing transistor SST is turned on and transfers to the first electrode of the light emitting element LD the reference voltage that is applied to the sensing line SLj.

The light emitting element LD outputs light corresponding to the drive electric current. The light emitting element LD may be an organic light emitting diode (OLED) or a microscopic inorganic light emitting diode with a micro- to nano-scale size, but the present disclosure is not limited to these diodes. Embodiments that result when the light emitting element LD is configured with the organic light emitting diode will be described below.

A structure of each of the pixels PXs according to the present disclosure is not limited to that illustrated in FIG. 2. In an embodiment, the pixels PXs each may further include at least one element for compensating for a threshold voltage of the drive transistor DT or initializing a voltage of the gate electrode of the drive transistor DT and/or a voltage of the anode electrode of the light emitting element LD.

An example where the switching transistor ST, the drive transistor DT, and the sensing transistor SST are NMOS transistors is illustrated in FIG. 2, but the present disclosure is not limited to this example. For example, at least one of transistors constituting each of the pixels PXs may be configured with a PMOS transistor. In various embodiments, each of the switching transistor ST, the drive transistor DT, and the sensing transistor SST may be realized as a low temperature polysilicon (LTPS) thin film transistor, an oxide thin film transistor, or a low temperature polycrystalline oxide (LTPO) thin film transistor.

Figure 3:
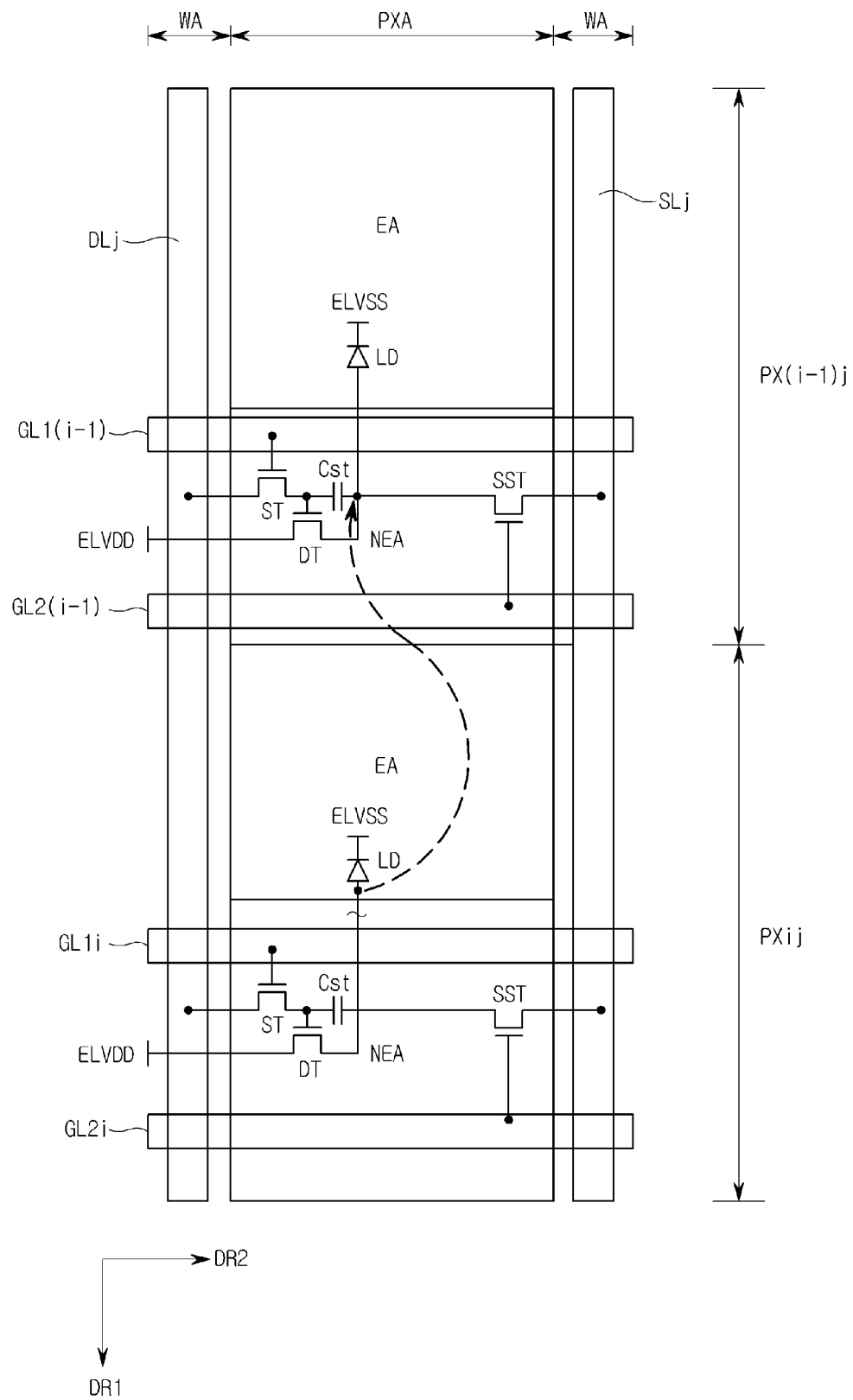
FIG. 3 is a view illustrating a method of repairing the display device according to the embodiment.

FIG. 3 is a view illustrating a method of repairing the display device according to the embodiment.

FIG. 3 illustrates two pixels PX(i−1)j and PXij that are arranged adjacent to each other in a first direction DR1. The pixels PX(i−1)j and PXij are arranged in a j-th pixel column and thus are both connected to the j-th data line DLj and a j-th sensing line SLj. In addition, a first pixel PX(i−1)j of the pixels PX(i−1)j and PXij is arranged in a (i−1)-th pixel row and is connected to (i−1)-th gate lines GL1(i−1) and GL2(i−1). Furthermore, a second pixel PXij thereof is arranged in an i-th pixel row and is connected to the i-th gate lines GL1i and GL2i.

With reference to FIG. 3, the display panel 50 includes a plurality of pixel regions PXAs that are in regions where the data line DLj and the sensing line SLj that extend in the first direction DR1, and gate lines GL1(i−1), GL1i, GL2(i−1), and GL2i extending in a second direction DR2 overlap. The pixels PX(i−1)j and PXij are arranged in the pixel regions PXAs.

The pixel regions PXAs may include light-emitting regions EAs where respective light emitting elements LDs of the pixels PX(i−1)j and PXij are arranged and non-light-emitting regions NEAs where a pixel circuit for driving the light emitting elements LDs is arranged.

Wiring line regions WAs may be between the pixel regions PXAs adjacent to each other in the second direction DR2. The data lines DLj and the sensing lines SLj that extend in the first direction DR1 are arranged in the wiring line region WA. First gate lines GL1(i−1) and GL1i and second gate lines GL2(i−1) and GL2i extend across the non-light-emitting region NEA in the second direction DR2.

The data lines DLj, the sensing lines SLj, the first gate lines GL1(i−1) and GL1i, and the second gate lines GL2(i−1) and GL2i are connected through contact holes to circuit elements that constitute the pixel circuit. Specifically, the data lines DLj may be connected to respective first electrodes (for example, source electrodes) of the switching transistors STs, respectively, and the sensing lines SLj may be connected to respective first electrodes (for example, source electrodes) of the sensing transistors SSTs, respectively. The first gate lines GL1(i−1) and GL1i are connected to respective gate electrodes of the switching transistors STs, and the second gate lines GL2(i−1) and GL2i are connected to respective gate electrodes of the sensing transistors SSTs.

In an embodiment, a malfunction may occur in the drive circuit for driving the light emitting element LD of the second pixel PXij, and thus the light emitting element may not properly emit light. In order to repair a malfunctioning pixel, for example, the second pixel PXij, the light emitting element LD of the second pixel PXij, as illustrated in FIG. 3, may be separated from the drive circuit. Subsequently, an anode electrode AE of the light emitting element LD of the second pixel PXij may be connected to an anode electrode AE of the light emitting element LD of the adjacent first pixel PX(i–1)j. Then, the drive electric current of the first pixel PX(i–1)j is applied to the light emitting element LD of the second pixel PXij. Accordingly, the second pixel PXij may emit light in a manner that corresponds to the same data signal as the first pixel PX(i–1)j does, and the malfunctioning pixel may be repaired.

A repair process may be performed through laser beam cutting and laser beam welding. For example, when a laser beam is emitted to the pixel circuit from the non-light-emitting region NEA of the second pixel PXij, the pixel circuit may be damaged, and thus the pixel circuit stops operating. Thereafter, the anode electrode AE of the light emitting element LD of the first pixel PX(i–1)j and the anode electrode AE of the light emitting element LD of the second pixel PXij may be connected to each other through the laser beam welding.

Figure 4:
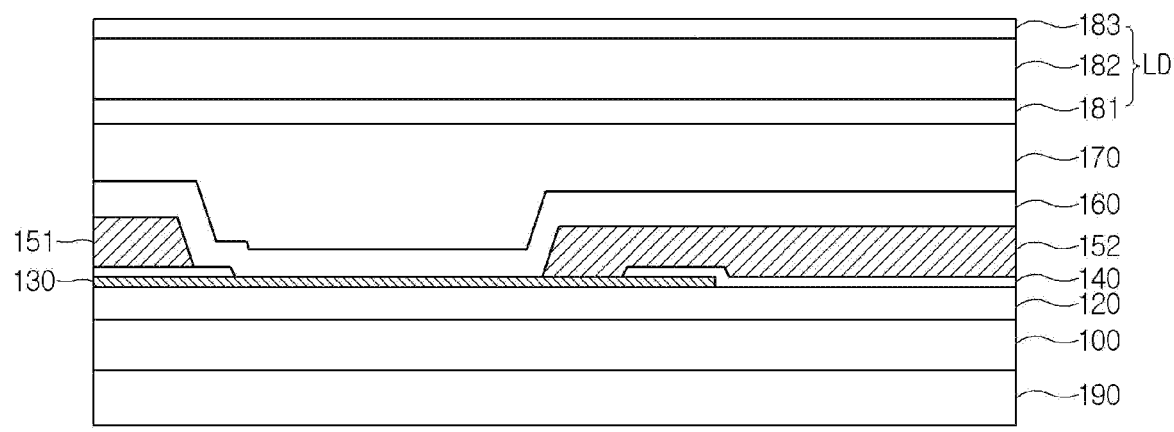
FIGS. 4 to 6 are views each illustrating a damage problem with a display panel that may occur in a pixel repair process.
Figure 5:
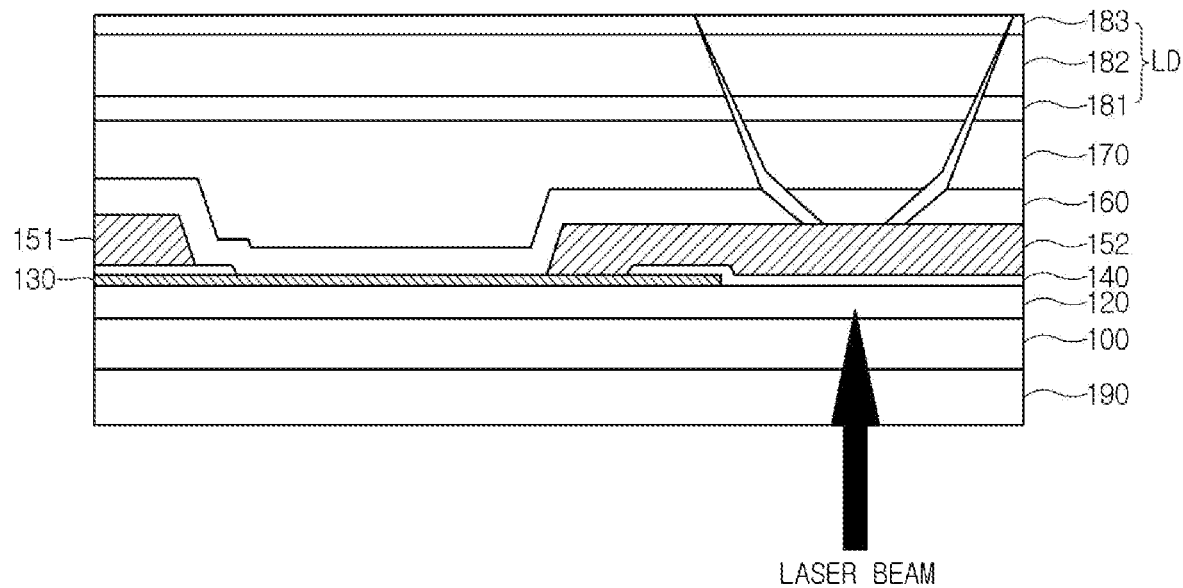
Figure 6:
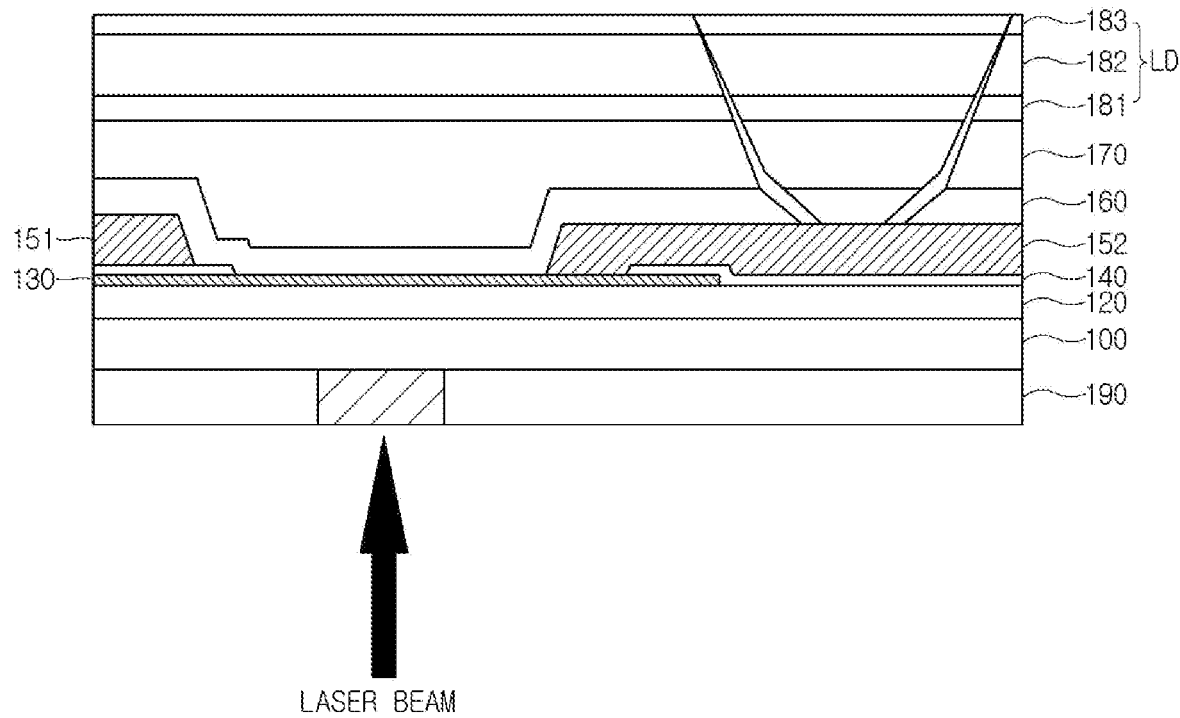

FIGS. 4 to 6 are views each illustrating a damage problem with a display panel that may occur in a pixel repair process.

With reference to FIG. 4, the display panel 50 may include a substrate 100, a circuit element layer that is formed overlying the substrate 100 and that includes at least one circuit element, and a light emitting layer that includes the light emitting element LD.

The substrate 100 may be covered by a buffer layer 120. An active layer 130 and a conductive layer that are, or may be, necessary to constitute a transistor may be formed overlying the buffer layer 120. The conductive layer may include a gate electrode 151 that is arranged in a manner that overlaps a channel region of the active layer 130 and a source electrode and a drain electrode that are connected to source and drain regions, respectively, of the active layer 130. In the drawings, a drain electrode 152 is illustrated as an example. An insulating layer 140 may be interposed between the active layer 130 and the conductive layer. The conductive layer may be covered with a protective layer 160 and an overcoat layer 170.

The light emitting element LD is formed overlying the overcoat layer 170. The light emitting element may have a structure where an anode electrode 181, a light emitting layer 182, and a cathode electrode 183 are stacked overlying each other.

A lower polarizer 190 may be further provided underneath the substrate 100.

In the display panel 50 as described above, the laser beam cutting may be performed on the conductive layer when repairing a pixel. For example, a laser beam may be emitted to the drain electrode 152 from a rear surface of a display panel 50.

When the laser beam is emitted to the drain electrode 152, the drain electrode 152 may be cut. A shock that occurs when cutting the drain electrode 152 propagates to the vicinity thereof, and thus a crack may develop in neighboring elements. The crack occurring at this time, as illustrated in FIG. 5, may propagate upward to insulating layers 160 and 170 and the light emitting element LD, and thus the light emitting element LD may be damaged.

In most cases, a laser beam in an infrared band (for example, having a wavelength of 1064 nm) is used to cut the conductive layer. In a case where the pixel PX is repaired by cutting the active layer 130 using the laser beam, the use of the laser beam in an ultraviolet band (for example, having a wavelength of 266 nm) is beneficial. As illustrated in FIG. 6, when a laser beam in a narrow wavelength band is emitted from below the display panel 50, the laser beam may be absorbed by the lower polarizer 190. Then, the laser beam does not propagate to the active layer 130, and thus the laser beam cutting cannot or may not be easily performed. In addition, there occurs a problem in that the lower polarizer 190, when absorbing the laser beam, may be damaged.

In order to solve these problems, according to an embodiment, a pixel repair structure where the pixel PX can be repaired by cutting the active layer 130 using the laser beam is provided. The pixel repair structure according to the embodiment will be described in more detail below.

Figure 7:
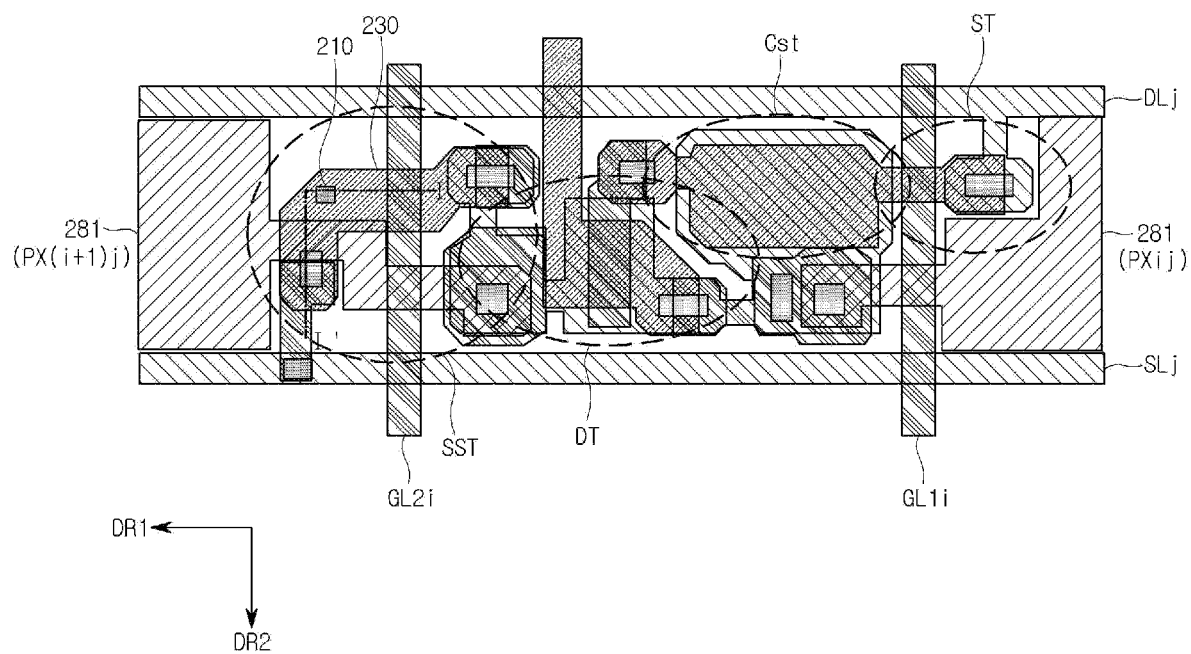
FIG. 7 is a plane view illustrating a pixel repair structure according to the embodiment.
Figure 8:
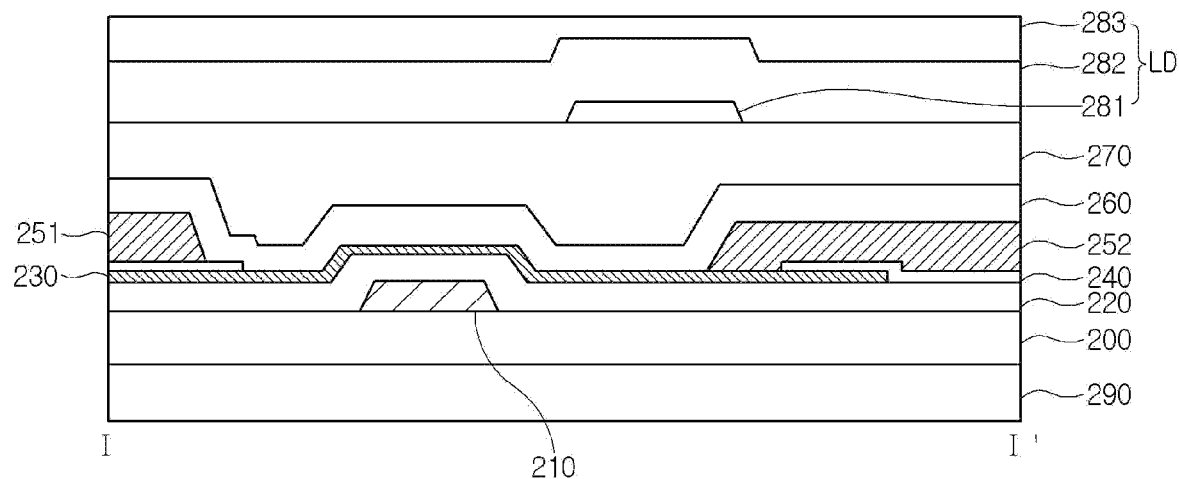
FIG. 8 is a cross-sectional view taken along line I-I' on FIG. 7.

FIG. 7 is a plane view illustrating the pixel repair structure according to the embodiment. FIG. 8 is a cross-sectional view taken along line I-I' on FIG. 7.

With reference to FIG. 7, together with FIGS. 1 and 2, the pixel PXij may include the switching transistor ST, the drive transistor DT, the sensing transistor SST, the storage capacitor Cst, and the light emitting element LD.

One electrode of the drive transistor DT is connected to a first power line PL1 to which the high-electric-potential drive voltage ELVDD is applied, and the other electrode thereof is connected to anode electrode 281 of the light emitting element LD. The gate electrode of the drive transistor DT is connected to one electrode of the storage capacitor Cst.

One electrode of the switching transistor ST is connected to the data line DLj, and the other electrode thereof is connected to the gate electrode of the drive transistor DT by way of the storage capacitor Cst. The gate electrode of the switching transistor ST is connected to the first gate line GL1i.

One electrode of the sensing transistor SST is connected to the sensing line SLj, and the other electrode thereof is connected to the anode electrode 281 of the light emitting element LD by way of the other electrode of the drive transistor DT.

One electrode of the storage capacitor Cst is connected to the gate electrode of the drive transistor DT, and the other electrode thereof is connected to the other electrode of the drive transistor DT.

The anode electrode 281 of the light emitting element LD may be connected to the other electrode of the drive transistor DT, and thus drive electric current may be applied to the anode electrode 281.

In an embodiment, the pixel PXij may include a repair pattern 210. The repair pattern 210 may be arranged in a manner that overlaps the active layer 230 of the transistor. For example, the repair pattern 210 may be arranged in such a manner that one region thereof overlaps the active layer 230 of the sensing transistor SST. In this case, it is desirable that the repair pattern 210 is not arranged in a manner that overlaps the conductive layer that constitutes the transistor.

The repair pattern 210 may be an electrode in an isolated form. The shape and size of the repair pattern 210 are not specifically limited.

A stacked structure of the display panel 50 will be described in more detail below.

With reference to FIG. 8, the display panel 50 may include a substrate 200, a circuit element layer that is formed overlying the substrate 200 and includes at least one circuit element, and a light emitting element layer including the light emitting element LD.

The substrate 200 serves as a base member of the display panel 50 and may be a transparent substrate. The substrate 200 may be a rigid substrate formed of glass or tempered glass or may be a flexible substrate formed of a plastic material.

The circuit element layer may be formed overlying the substrate 200 and may include circuit elements (for example, a transistor, a capacitor, and the like) that constitute the pixel PX, and wiring lines.

The repair pattern 210 may be arranged, as a first conductive layer, directly on top of or overlying the substrate 200. The repair pattern 210 may be arranged in such a manner that at least one region thereof overlaps the active layer 230. For example, the repair pattern 210 may be arranged in such a manner that at least one region thereof overlaps the active layer 230 constituting the sensing transistor SST. The repair pattern 210 may be an electrode in an island form. The shape and size of the repair pattern 210 are not specifically limited. However, the repair pattern 210 may have a sufficiently large region that overlaps the active layer 230 in such a manner that when repairing the pixel, the laser beam emitted to the repair pattern 210 sufficiently propagates to the active layer 230 and that a crack thus develops in the active layer 230.

A light blocking layer may be further arranged on a layer that is the same as the repair pattern 210. The light blocking layer may overlap the channel region of the active layer constituting the drive transistor DT and thus may protect an oxide semiconductor element from external light.

The first conductive layer may be formed of one selected from a group consisting of molybdenum (Mo), aluminum (Al), chromium (Cr), gold (Au), titanium (Ti), nickel (Ni), neodymium (Nd) and copper (Cu), or may be formed of an alloy of these materials. For example, the first conductive layer may be formed of copper or an alloy of which a main component is copper.

A buffer layer 220 is arranged overlying the substrate 200 in such a manner as to cover the first conductive layer. The buffer layer 220 may prevent ions or impurities from being diffused from the substrate 200 and may block water penetration.

The active layer 230 may be formed overlying or directly on top of the buffer layer 220. The active layer 230 may be formed of a silicon-based semiconductor material or an oxide semiconductor material. For example, the active layer 230 may be formed of indium gallium zinc oxide (IGZO) that is an oxide semiconductor. The active layer 230 may include a source region and a drain region that contain p-type or n-type impurities, and a channel that is formed between the source region and the drain region. In an embodiment, the active layer 230 may be thinly formed in such a manner to have a thickness of about 300 Å. For example, the thickness may be 300 Å, substantially 300 Å, in a range of about 200 Å to about 400 Å, in a range of about 250 Å to about 350 Å, or in another suitable range. The thickness may be any thickness in the ranges listed, such as 232 Å, 307 Å, 400 Å or the like.

One region of the active layer 230 may be arranged in a manner that overlaps the repair pattern 210. For example, one region of the active layer 230 constituting the sensing transistor SST may overlap the repair pattern 210.

Electrodes 251 and 252 of transistors may be formed, as a second conductive layer, directly on top of or overlying the active layer 230. Respective gate electrodes of transistors may be arranged in a manner that overlaps the channel region of the active layer 230. Respective source and drain electrodes of the transistors may be connected to source and drain regions, respectively, of the active layer 230. As an example, FIG. 8 illustrates that the channel region of the active layer 230 and the gate electrode overlap and that the drain electrode 252 is connected to the drain region of the active layer 230.

In an embodiment, the second conductive layer may be arranged in such a manner as not to overlap the repair pattern 210. Accordingly, when a laser beam is emitted to the repair pattern 210, energy of the laser beam may be prevented from propagating to the second conductive layer, or a crack in the active layer 230 may be prevented from propagating to the second conductive layer.

An insulating layer 240 may be interposed between the active layer 230 and the second conductive layer. The insulating layer 240 may be formed of silicon oxide (SiOx) or silicon nitride (SiNx), or may be a multi-layer formed of these materials.

The circuit element layer may be covered by a passivation layer 260 and an overcoat layer 270. The passivation layer 260 may be an insulating film for protecting elements below, and the overcoat layer 270 may be a flattened film for alleviating a step in a lower structure. In an embodiment, a color filter (not illustrated) may be formed between the passivation layer 260 and the overcoat layer 270. The color filter may be formed in the light-emitting region EA. The color filter is a wavelength-selective optical filter that selectively transmits incident light in only one portion of a wavelength band by transmitting light in a specific wavelength band and blocking light in a different specific wavelength band, and may be formed of photosensitive resin including a colorant such as a pigment or a dye. Light passing through the color filter in the light emitting region EA may have one of red, green, and blue colors.

The light emitting element layer is formed directly on top of or overlying the overcoat layer 270 and includes the light emitting elements LDs. The light emitting element LD includes the anode electrode 281, a light emitting layer 282, and a cathode electrode 283.

The anode electrode 281 is formed directly on top of or overlying the overcoat layer 270. The anode electrode 281 is connected to the drive transistor DT through a via hole passing through the overcoat layer 270 and the passivation layer 260. The anode electrode 281 may be formed of a transparent conductive material, such as indium tin oxide (ITO), indium zinc oxide (IZO), or zinc oxide (ZnO). In a case where the anode electrode 281 is a reflective electrode, the anode electrode 281 may be formed as a triple layer configured with a transparent conductive layer, a reflective layer (a metal oxide layer) and a transparent conductive layer. For example, the anode electrode 281 may be formed as a triple layer containing ITO/Ag/ITO.

The light emitting layer 282 is formed on top of the anode electrode 281. The light emitting layer 282 is formed in such a manner as to cover the anode electrode 281. The light emitting layer 282 may be widely formed overlying the display panel 50. The light emitting layer 282 may have a multi-layered thin film structure that includes a light generation layer. In this case, colors of lights generated in the light generation layer may be white, red, blue, green, and the like. However, the lights are not limited to these colors. The cathode electrode 283 may be formed on top of the light emitting layer 282.

The cathode electrode 283 may be widely formed on top of the display panel 50. The cathode electrode 283 may be formed of a transparent conductive material (TCO) capable of transmitting light or may be formed of a semi-transmissive conductive material, such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy of these materials.

A lower polarizer 290 may be further provided underneath the substrate 200.

Figure 9:
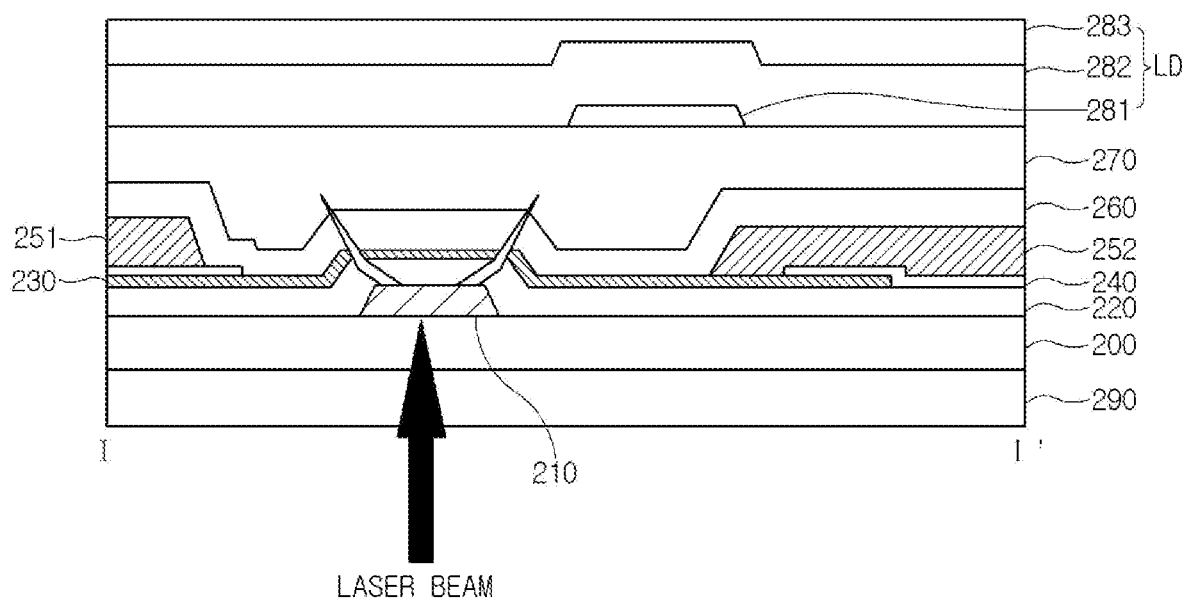
FIGS. 9 and 10 are views each illustrating an implementation example of a repaired pixel.
Figure 10:
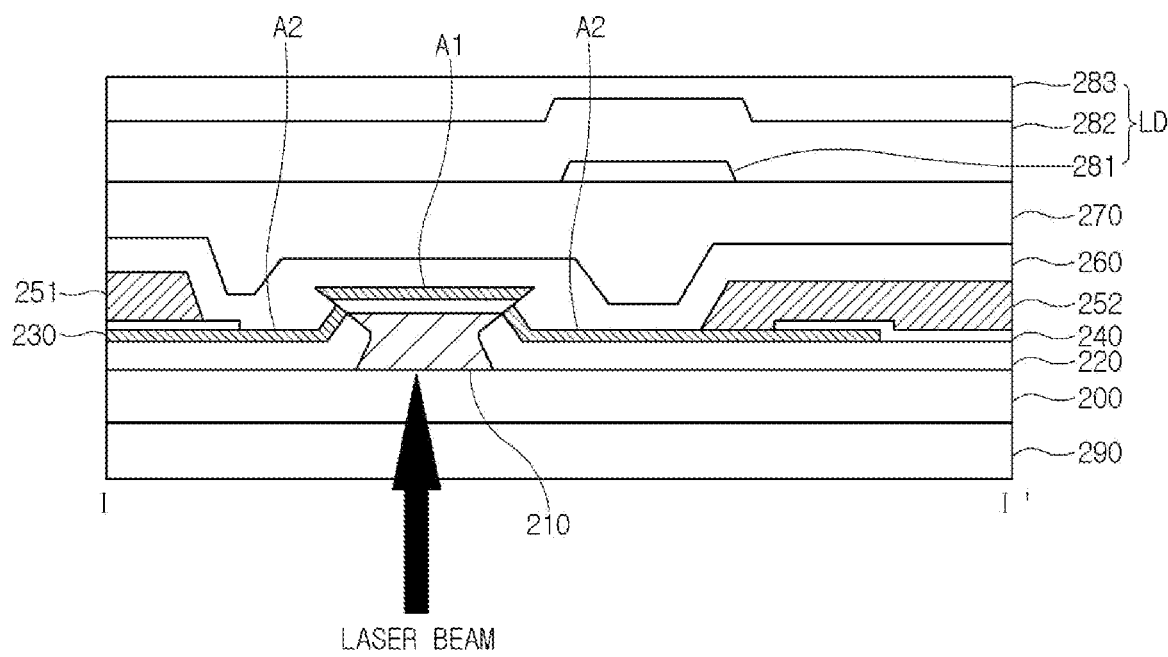

FIGS. 9 and 10 are views each illustrating an implementation example of a repaired pixel.

A malfunction in the pixel PXij may be detected in the display panel 50 illustrated in FIGS. 7 and 8. Through visual inspection (image-capturing and analysis) and/or electrical inspection (pixel sensing or the like) of the display panel 50, it can be checked whether or not the pixel PXij malfunctions.

When the malfunction is detected, the laser beam cutting is performed on the active layer 230. To this end, a laser beam may be emitted to the repair pattern 210. Then, the repair pattern 210 is cut by the laser beam. A shock that occurs when cutting the repair pattern 210, as illustrated in FIG. 9, may propagate upward to the buffer layer 220 and the active layer 230. Due to this shock, a crack may develop in the buffer layer 220 and the active layer 230. As described above, since the active layer 230 is thinly formed in such a manner as to have a thickness of approximately 300 Å, the active layer 230 may be easily cut. The cutting of the active layer 230 may interrupt a function of the circuit element and thus may release an electric connection between the pixel circuit in which the malfunction occurs and the light emitting element LD.

After cut, the active layer 230, as illustrated in FIGS. 9 and 10, is divided into cut-off regions at the vicinity of opposite ends of the repair pattern 210. Specifically, as illustrated in FIG. 10, the active layer 230 may include a first region A1 arranged over the repair pattern 210, and second regions A2 arranged adjacent to opposite end portions, respectively, of the first region A1. The first region A1 and the second regions A2 may be separated from each other at the vicinity of the opposite end portions of the repair pattern 210. In an embodiment, as illustrated in FIG. 10, a step is formed in the vicinity of opposite end portions of a middle cut-off region among the cut-off regions, that is, occurs between the first regions A1 and each of the second regions A2.

In the embodiment as described above, a laser beam is emitted to cut the repair pattern 210. A laser beam in an infrared band may be used to cut the repair pattern 210 formed of a metal material. A wavelength of the laser beam may be approximately 1064 nm. The laser beam in the infrared band may propagate directly to the repair pattern 210 without being absorbed by the lower polarizer 290. Therefore, the lower polarizer 290 is not damaged by the laser cutting.

The repair pattern 210 is arranged in such a manner as not to overlap the conductive layer on top of the active layer 230 or the light emitting element LD. Therefore, a shock that occurs when cutting the repair pattern 210 does not propagate to the light emitting element LD, and thus the light emitting element LD may be prevented from being damaged.

Although the specific embodiment of the present disclosure has been described for illustrative purposes, those skilled in the art will appreciate that various modifications, additions and substitutions are possible, without departing from the scope and spirit of the disclosure as disclosed in the accompanying claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
   a substrate on which circuit elements are arranged, the circuit elements being configured to drive a pixel;
   a repair pattern arranged overlying the substrate, wherein the repair pattern has been repaired using a laser beam;
   a buffer layer covering the repair pattern;
   an active layer arranged on top of the buffer layer;
   a conductive layer which is arranged overlying the active layer, the conductive layer including electrodes of the circuit elements;
   an overcoat layer covering the conductive layer; and
   a light emitting element arranged overlying the overcoat layer,
   wherein the repair pattern is arranged in such a manner that one region thereof overlaps the active layer, and
   wherein the active layer is divided into cut-off regions at a vicinity of opposite ends of the repair pattern.

2. The display device of claim 1, wherein the repair pattern is an electrode in an isolated form, the electrode being formed of a metal material.

3. The display device of claim 1, wherein the active layer comprises:
   a first region overlapping the repair pattern; and
   second regions arranged adjacent to opposite end portions, respectively, of the first region.

4. The display device of claim 3, wherein the first region and the second regions are separated from each other.

5. The display device of claim 4, wherein a step is formed between the first region and each of the second regions.

6. The display device of claim 1, wherein the circuit elements each comprise:
   a storage capacitor;
   a switching transistor storing a voltage corresponding to a data signal in the storage capacitor, in response to a first gate signal;
   a drive transistor configured to control an amount of drive electric current to be applied to the light emitting element in a manner that corresponds to the voltage stored in the storage capacitor; and
   a sensing transistor configured to sense features of the circuit elements in response to a second gate signal,
   wherein the active layer overlapping the repair pattern is an active layer constituting the sensing transistor.

7. The display device of claim 6 further comprising:
   a light blocking layer arranged on a layer that is the same as the repair pattern and arranged in a manner that overlaps the drive transistor.

8. The display device of claim 1, further comprising:
   a lower polarizer arranged underneath the substrate.

9. The display device of claim 1, wherein the active layer is formed of indium-gallium-zinc-oxide, and the repair pattern is formed of copper.

10. The display device of claim 1, wherein the active layer is formed in such a manner to have a thickness of about 300 Å.

11. A display device comprising:
a substrate on which circuit elements are arranged, the circuit elements being configured to drive a pixel;
a repair pattern arranged overlying the substrate, wherein the repair pattern has been repaired using a laser beam;
a buffer layer covering the repair pattern;
an active layer arranged on top of the buffer layer, the active layer including a first region overlapping the repair pattern and a second region adjacent to an end portion of the first region, a step being present between the first region and the second region;
a conductive layer which is arranged overlying the active layer, the conductive layer including electrodes of the circuit elements;
an overcoat layer covering the conductive layer; and
a light emitting element arranged overlying the overcoat layer,
wherein the repair pattern is arranged in such a manner that one region thereof overlaps the active layer.

12. The display device of claim 11, wherein the repair pattern is an electrode in an isolated form, the electrode being formed of a metal material.

13. The display device of claim 11, wherein the circuit elements each comprise:
a storage capacitor;
a switching transistor storing a voltage corresponding to a data signal in the storage capacitor, in response to a first gate signal;
a drive transistor configured to control an amount of drive electric current to be applied to the light emitting element in a manner that corresponds to the voltage stored in the storage capacitor; and
a sensing transistor configured to sense features of the circuit elements in response to a second gate signal,
wherein the active layer overlapping the repair pattern is an active layer constituting the sensing transistor.

14. The display device of claim 13 further comprising:
a light blocking layer arranged on a layer that is the same as the repair pattern and arranged in a manner that overlaps the drive transistor.

* * * * *